US008902522B2

(12) United States Patent
Lee et al.

(10) Patent No.: US 8,902,522 B2
(45) Date of Patent: Dec. 2, 2014

(54) COLORED PHOTOSENSITIVE RESIN COMPOSITION FOR PREPARATION OF COLOR FILTER OF SOLID-STATE IMAGE SENSING DEVICE USING 300 NM OR LESS ULTRASHORT WAVE EXPOSURE EQUIPMENT, COLOR FILTER USING SAME, AND SOLID-STATE IMAGE SENSING DEVICE CONTAINING SAME

(75) Inventors: Sang Haeng Lee, Daejeon (KR); Seung No Lee, Gwangmyeong-si (KR); Jeung Hoon On, Daejeon (KR); Ji Min Chun, Jeonju-si (KR)

(73) Assignee: Dongwoo Fine-Chem Co., Ltd. (KR)

( * ) Notice: Subject to any disclaimer, the term of this patent is extended or adjusted under 35 U.S.C. 154(b) by 13 days.

(21) Appl. No.: 13/381,289

(22) PCT Filed: Jul. 1, 2010

(86) PCT No.: PCT/KR2010/004288
§ 371 (c)(1),
(2), (4) Date: Jan. 9, 2012

(87) PCT Pub. No.: WO2011/002247
PCT Pub. Date: Jan. 6, 2011

(65) Prior Publication Data
US 2012/0099214 A1    Apr. 26, 2012

(30) Foreign Application Priority Data

Jul. 2, 2009 (KR) .................. 10-2009-0060147
Jul. 2, 2009 (KR) .................. 10-2009-0060148
Jul. 2, 2009 (KR) .................. 10-2009-0060149

(51) Int. Cl.
*G02B 5/22* (2006.01)
*G02B 5/20* (2006.01)
*G03F 7/031* (2006.01)
*G03F 7/00* (2006.01)

(52) U.S. Cl.
CPC .............. *G02B 5/223* (2013.01); *G02B 5/201* (2013.01); *G03F 7/031* (2013.01); *G03F 7/0007* (2013.01)
USPC ........................ 359/885; 252/582; 252/589

(58) Field of Classification Search
CPC .......... G02B 5/208; G02B 5/22; G02B 5/282; G02B 1/10; G02B 13/14; G02B 1/04; G02B 1/11; G02B 1/002; G02B 1/115; G02B 5/0808; G02B 5/28; G02B 5/283; G02B 5/286
USPC .............. 359/350, 359–361, 885; 250/503.1, 250/504 R; 252/582, 588, 589
See application file for complete search history.

(56) References Cited

U.S. PATENT DOCUMENTS

2003/0050499 A1* 3/2003 Inada et al. .................. 560/76
2003/0073015 A1* 4/2003 Tamoto et al. ............... 430/66

FOREIGN PATENT DOCUMENTS

CN    101014569 A    8/2007
JP    2008-509967 A    4/2008
(Continued)

OTHER PUBLICATIONS

PCT/KR2010/004288, Feb. 23, 2011, International Search Report.

*Primary Examiner* — William Choi
*Assistant Examiner* — Sharrief Broome
(74) *Attorney, Agent, or Firm* — Workman Nydegger (57) ABSTRACT

Disclosed is a colored photosensitive resin composition for a color filter of a solid state imaging device using an ultra-short wavelength exposing device of 300 nm or less, a color filter and a solid state imaging device including the same. The colored photosensitive resin composition can fabricate a color filter having a micro-patterned colored pattern. The color filter can be advantageously applied to a solid state imaging device.

6 Claims, 3 Drawing Sheets

(56) References Cited

FOREIGN PATENT DOCUMENTS

| JP | 2008-287213 A | 11/2008 |
| JP | 2010-139692 A | 6/2010 |
| KR | 10-2007-0044062 | 4/2007 |
| KR | 10-2008-0088400 | 10/2008 |
| KR | 10-2009-0040232 | 4/2009 |
| KR | 10-2009-0058458 | 6/2009 |

* cited by examiner

COLORED PHOTOSENSITIVE RESIN COMPOSITION FOR PREPARATION OF COLOR FILTER OF SOLID-STATE IMAGE SENSING DEVICE USING 300 NM OR LESS ULTRASHORT WAVE EXPOSURE EQUIPMENT, COLOR FILTER USING SAME, AND SOLID-STATE IMAGE SENSING DEVICE CONTAINING SAME

CROSS-REFERENCE TO RELATED APPLICATIONS

This Patent Application is a U.S. National Stage of International Application No. PCT/KR2010/004288, filed on Jul. 1, 2010, which claims the benefit of KR Application Nos. 10-2009-0060147; KR Application No. 10-2009-0060148 and KR Application No. 10-2009-0060149, all of which were filed on Jul. 2, 2009. All of the aforementioned applications are incorporated herein by reference in their entirety.

TECHNICAL FIELD

The present invention relates to a colored photosensitive resin composition for a color filter of a solid state imaging device using an ultra-short wavelength exposing device of 300 nm or less, a color filter and a solid state imaging device including the same.

BACKGROUND ART

As is well known, an imaging device for implementing a color image includes color filters formed on a photosensitive portion for receiving light from the outside and generating and accumulating photocharges. The color filters may have colored patterns of three colors of red, green and blue, or may have colored patterns of three colors of yellow, magenta and cyan.

The colored pattern of each of the color filters is formed using a colored photosensitive resin composition including a pigment or a dye. The colored pattern formed of the colored photosensitive resin composition is generally prepared by lithography. In general, g-line (wavelength 436 nm) and i-line (wavelength 365 nm) are generally used in a light source for lithography used in preparing the color pattern.

In recent years, in order to achieve a high-pixel trend and improve picture quality, there has been demand for solid state imaging device having a pixel size reduced from 4-5 μm to 2 μm or less, such as a digital camera. Accordingly, micro-patterning and rectangular shapes of colored patterns are required.

To address the above demand, there has been research into techniques for forming a colored pattern using a colored photosensitive resin composition including dyes or forming a colored pattern by applying a dye to a prefabricated pattern. However, since the dye is poor in heat resistance and light-fastness, reliability of the dye may deteriorate. In addition, a pattern size, which can be implemented in a wavelength range of 365 nm to 463 nm, which is used for the light source used in the conventional process for color pattern formation, has reached a limit resolution.

Accordingly, the inventors of the present invention conducted research into technique for micro-patterning colored patterns of a color filter for a solid state imaging device using an ultra-short wavelength exposure device of 300 m or less. However, the conventional colored photosensitive resin composition is problematic in that hardening is not efficiently performed in ultra-short wavelength of 300 nm or less. In addition, even if hardening is performed in ultra-short wavelength of 300 nm or less, the sensitivity and resolution may deteriorate.

DISCLOSURE OF THE INVENTION

In order to overcome the above-mentioned shortcomings, the present invention provides a colored photosensitive resin composition for a color filter of a solid state imaging device, which can fabricate a high-resolution, micro-patterned colored pattern in the course of forming the color filter for a solid state imaging device using an ultra-short wavelength exposing device of 300 nm or less.

The present invention provides a colored photosensitive resin composition for a color filter of a solid state imaging device, which can form a high-resolution, micro-patterned colored pattern in the course of forming the color filter for a solid state imaging device, which exhibits high sensitivity using a small amount of a photoinitiator to form the colored pattern even with a small exposure dose.

The present invention also provides a colored photosensitive resin composition for a color filter of a solid state imaging device, which can form a high-resolution, micro-patterned colored pattern in the course of forming the color filter for a solid state imaging device, which exhibits high sensitivity and has good line characteristics even with a small exposure energy dose.

The present invention also provides a color filter, which can form a high-resolution, micro-patterned colored pattern using a colored photosensitive resin composition.

The present invention also provides a solid state imaging device including the color filter.

According to an aspect of the invention, there is provided a colored photosensitive resin composition for a color filter of a solid state imaging device using an ultra-short wavelength exposing device of 300 nm or less, the colored photosensitive resin composition comprising a colorant, a binder resin, a photopolymerizable compound, a photoinitiator and a solvent, wherein the photoinitiator includes a compound reacting at a wavelength of 300 nm or less.

The photoinitiator may be at least one selected from the group consisting of acetophenone-, benzophenone-, thioxanthone- and triazine-based photoinitiators, the photoinitiator contained in an amount of 5 wt % to 20 wt % based on solid content of the colored photosensitive resin composition.

The photoinitiator may be at least one selected from the group consisting of acetophenone-based and benzophenone-based photoinitiators.

The photoinitiator may be an oxime ester photoinitiator.

The photoinitiator may be contained in an amount of 1 wt % to 20 wt % based on solid content of the colored photosensitive resin composition.

The photoinitiator may include an oxime ester photoinitiator and further includes an additional photoinitiator other than the oxime ester photoinitiator.

The additional photoinitiator may include at least one selected from the group consisting of an active radical generator selected from acetophenone-, benzophenone-, thioxanthone-, triazine- and benzoin-based photoinitiators, a sensitizer and an acid generator.

The oxime ester photoinitiator may be contained in an amount of 1 to 99 wt % based on the entire amount of the photoinitiator containing the oxime ester photoinitiator.

The photoinitiator may be contained in an amount of 1 to 50 wt % based on the solid content of the colored photosensitive resin composition.

The ultra-short wavelength exposing device of 300 nm or less may be a KrF scanner having a wavelength of 248 nm.

According to still another aspect of the invention, there is provided a color filter including a colored pattern formed by coating a colored photosensitive resin composition on a substrate to give a coating film, exposing light to the coating film into a predetermined pattern using an ultra-short wavelength exposing device of 300 nm or less and developing the resultant structure. The aforementioned colored photosensitive resin composition can be any one of the immediately following embodiments of a colored photosensitive resin composition.

Embodiment 1

A colored photosensitive resin composition for a color filter of a solid slate imaging device using an ultra-short wavelength exposing device of 300 nm or less, the colored photosensitive resin composition comprising a colorant, a binder resin, a photopolymerizable compound, a photoinitiator and a solvent, wherein the photoiniliator includes a compound reacting at a wavelength of 300 nm or less.

Embodiment 2

The colored photosensitive resin composition of embodiment 1, wherein the photoinitiator is at least one selected from the group consisting of acetophenone. benzophenone. thioxanihone- and triazine-based photoiniciators. the photoinitiator contained in an amount of 5 wt. % to 20 wt. % based on solid content of the colored photosensitive resin composition.

Embodiment 3

The colored photosensitive resin composition of embodiment 2, wherein the photoinitiator is at least one selected from the group consisting of acetophenone- based and ben/ophenone-based photoinitiators.

Embodiment 4

The colored photosensitive resin composition of embodiment 1, wherein the photoinitiator is an oxime ester photoinitiator.

Embodiment 5

The colored photosensitive resin composition of embodiment 4, wherein the photoinitiator is contained in an amount of 1 wt. % to 20 wt. based on solid content of the colored photosensitive resin composition.

Embodiment 6

The colored photosensitive resin composition of embodiment 1, wherein the photoinitiator includes an oxime ester photoinitiator and further includes an additional photoinitiator other than tto oxime csier photoiniliator.

Embodiment 7

The colored photosensitive resin composition of embodiment 6, wherein the additional phqtoinjtjator includes at least one selected from the group consisting of an active radical generator selected from acctophcnonc-, benzophenone-, thioxanthonc-, triazine- and benzoin-based photoinitiators, a sensitizer and an acid generator.

Embodiment 8

The colored photosensitive resin composition of embodiment 6, wherein the oxime ester photoinitiator is contained in an amount of 1 to 99 wt. % based on the entire amount of the photoinitiator containing the oxime cslcr photoinitiator.

Embodiment 9

The colored photosensitive resin composition of embodiment 6, wherein the photoinitiator is contained in an amount of 1 to 50 wt. % based on the solid content of the colored photosensitive resin composition.

Embodiment 10

The colored photosensitive resin composition of embodiment 1, wherein the ultra-short wavelength exposing device of 300 nm or less is a KrF scanner having a wavelength of 248 nm.

The ultra-short wavelength exposing device of 300 nm or less may be a KrF scanner having a wavelength of 248 nm.

According to still another aspect of the invention, there is provided a solid state imaging device including the color filter.

ADVANTAGEOUS EFFECTS

As described above, since the colored photosensitive resin composition according to the present invention includes a photoinitiator reacting at ultra-short wavelength of 300 nm or less, a high-resolution, micro-patterned colored pattern can be fabricated during exposure using an ultra-short wavelength exposing device of 300 nm or less in the course of forming a color filter.

In particular, a high-resolution, micro-patterned colored pattern can be fabricated during exposure using an ultra-short wavelength exposing device of 300 nm or less in the course of forming a color filter using a photoinitiator reacting at ultra-short wavelength of 300 nm or less in an excess amount based on a photoinitiator included in the conventional colored photosensitive resin composition, the photoinitiator including at least one selected from acetophenone-, benzophenone-, thioxanthone- and triazine-based photoinitiators.

In addition, if an oxime ester photoinitiator reacting in ultra-short wavelength of 300 nm or less is included as the photoinitiator, high sensitivity is exhibited using a small amount of the photoinitiator, thereby fabricating a high-resolution, micro-patterned colored pattern with a small exposure energy dose.

In addition, if a photoinitiator other than an oxime ester photoinitiator reacting at ultra-short wavelength of 300 nm or less is included as the photoinitiator, good line characteristics are exhibited, thereby fabricating a high-resolution, micro-patterned colored pattern with a small exposure energy dose.

The colored pattern may be fabricated to have a small size of 1.4 μm or less, specifically 1.0 μm or less. Accordingly, the color filter can be advantageously used for a solid state imaging device.

BRIEF DESCRIPTION OF THE DRAWINGS

The objects, features and advantages of the present invention will be more apparent from the following detailed description in conjunction with the accompanying drawings, in which.

BEST MODE FOR CARRYING OUT THE INVENTION

Hereinafter, embodiments of the present invention will be described in detail with reference to the accompanying drawings.

A colored photosensitive resin composition for a color filter of a solid state imaging device using an ultra-short wavelength exposing device of 300 nm or less according to the present invention, (to be simply referred to as a "colored photosensitive resin composition" hereinafter) includes a colorant (A), a binder resin (B), photopolymerizable compound (C), a photoinitiator (D) and a solvent (E).

Colorant (A)

An organic or inorganic pigment may be used as the colorant. Preferably, an organic pigment is used in consideration of heat resistance and color ability. The pigment can be used alone or in combination of two or more.

The organic pigment can be, if necessary, subjected to a rosin treatment, a surface treatment using a pigment derivative having an acidic group or a basic group, or the like, a graft treatment on the pigment surface with a polymer, a fine particle treatment such as a sulfuric acid fine particle method, a washing for removing impurities with an organic solvent, water or the like.

The pigment may include compounds classified in pigments in Color index (The Society of Dyers and Clolurists). Specific examples of the organic pigments include compounds of the following color index (C.I.) number, although organic colorants usable in the present invention are not limited to the compounds:

C.I. pigment yellow 1, C.I. pigment yellow 12, C.I. pigment yellow 13, C.I. pigment yellow 14, C.I. pigment yellow 15, C.I. pigment yellow 16, C.I. pigment yellow 17, C.I. pigment yellow 20, C.I. pigment yellow 24, C.I. pigment yellow 31, C.I. pigment yellow 53, C.I. pigment yellow 83, C.I. pigment yellow 86, C.I. pigment yellow 93, C.I. pigment yellow 94, C.I. pigment yellow 109, C.I. pigment yellow 110, C.I. pigment yellow 117, C.I. pigment yellow 125, C.I. pigment yellow 128, C.I. pigment yellow 137, C.I. pigment yellow 138, C.I. pigment yellow 139, C.I. pigment yellow 147, C.I. pigment yellow 148, C.I. pigment yellow 150, C.I. pigment yellow 153, C.I. pigment yellow 154, C.I. pigment yellow 166, C.I. pigment yellow 173 and the like;

C.I. pigment orange 13, C.I. pigment orange 31, C.I. pigment orange 36, C.I. pigment orange 38, C.I. pigment orange 40, C.I. pigment orange 42, C.I. pigment orange 43, C.I. pigment orange 51, C.I. pigment orange 55, C.I. pigment orange 59, C.I. pigment orange 61, C.I. pigment orange 64, C.I. pigment orange 65, C.I. pigment orange 71, C.I. pigment orange 73 and the like;

C.I. pigment red 9, C.I. pigment red 97, C.I. pigment red 105, C.I. pigment red 122, C.I. pigment red 123, C.I. pigment red 144, C.I. pigment red 149, C.I. pigment red 166, C.I. pigment red 168, C.I. pigment red 176, C.I. pigment red 177, C.I. pigment red 180, C.I. pigment red 192, C.I. pigment red 215, C.I. pigment red 216, C.I. pigment red 224, C.I. pigment red 242, C.I. pigment red 254, C.I. pigment red 264, C.I. pigment red 265 and the like;

C.I. pigment blue 15, C.I. pigment blue 15:3, C.I. pigment blue 15:4, C.I. pigment blue 15:6, C.I. pigment blue 60 and the like;

C.I. pigment violet 1, C.I. pigment violet 19, C.I. pigment violet 23, C.I pigment violet 29, C.I pigment violet 32, C.I pigment violet 36, C.I pigment violet 38 and the like;

C.I. pigment green 7, C.I. pigment green 36 and the like; and

C.I. pigment brown 23, C.I. pigment brown 25 and the like.

The colorant is used in an amount of 5 wt % to 60 wt %, preferably 10 wt % to 50 wt % based on solid content of the colored photosensitive resin composition. When the colorant is used in an amount falling under the range stated above, the colored pattern of the prepared color filter has sufficiently high color concentration and mechanical strength.

Here, the colorant may be used in the form of a dispersing solution (which may be referred to as a mill base hereinafter), which is obtained by dispersing with a bead mill or the like until the colorant attains an average particle size of approximately 0.2 µm or less. During dispersion, a pigment dispersant may be additionally dispersed in the dispersing solution. In addition, a binder resin may be distributed and dispersed in the dispersing solution in part or in whole.

When the dispersing solution includes a colorant and a solvent, the colorant is generally contained in an amount of 5 to 60 parts by weight, preferably 10 to 40 parts by weight, based on 100 parts by weight of the dispersing solution.

In addition, when a pigment dispersant is additionally contained in the dispersing solution, examples of the pigment dispersant may include a polyester-based polymer dispersant, an acryl-based polymer dispersant, a polyurethane-based polymer dispersant, a positive ionic surfactant, a negative ionic surfactant, and a non-ionic surfactant, which can be used alone or in combination of two or more.

In particular, useful examples of the pigment dispersant may include commercially available surfactants. Specific examples of the surfactant may include polyoxyethylene alkylethers, polyoxyethylene alkylphenylethers, polyethylene glycoldiesters, sorbitan fatty acid esters, modified fatty acid polyesters, tertiary amine modified polyurethanes, and polyethylene imines. The following are trade names: KP (ShinEtsu Chemical Industry), Polyflow (manufactured by Kyoeisha Oil Chemical Industry), EF-Top (manufactured by Tochem Products Co., Ltd.), Megafac (manufactured by Dai-Nippon Ink Chemical Industry), Fluorade (manufactured by Sumitomo 3M), Asahi Guard, Surflon (manufactured by Asahi Glass), SOLSPERSE (manufactured by Zeneca), EFKA (manufactured by EFKA Chemicals Co. Ltd), PB 821 (manufactured by Ajinomoto Fine Techno) and so on.

The pigment dispersant is contained in an amount of 0.01 to 1 part by weight based on 1 part by weight of the colorant, preferably 0.05 to 0.5 part by weight, in view of dispersion of the colorant.

In the present invention, the solid content in the colored photosensitive composition means a total amount of solvent-removed components.

Binder Resin (B)

The binder resin functions as a binder resin for a colorant, and any polymer that can be dissolved in an alkali developer solution used in a development.

For example, the binder resin may be a copolymer of a carboxyl group-containing monomer and another monomer copolymerizable with the carboxyl group-containing monomer.

Examples of the carboxyl group-containing monomer may include unsaturated carboxylic acid having one or more carboxyl groups, such as unsaturated monocarboxylic acid, unsaturated dicarboxylic acid, or unsaturated tricarboxylic acid.

Here, examples of the unsaturated monocarboxylic acid may include acrylic acid, methacrylic acid, crotonic acid, α-chloroacrylic acid, and cinnamic acid.

Examples of the unsaturated dicarboxylic acid may include maleic acid, fumaric acid, itaconic acid, citraconic acid, and mesaconic acid.

The unsaturated polycarboxylic acid may be an acid anhydride. Specific examples of the unsaturated polycarboxylic acid may include maleic acid anhydride, itaconic acid anhydride, and citraconic acid anhydride.

In addition, the unsaturated polycarboxylic acid may be mono(2-methacryloyloxyalkyl)ester thereof. Examples of the unsaturated polycarboxylic acid may include succinate mono(2-acryloyloxyethyl), succinate mono(2-methacryloyloxyethyl), phthalate mono(2-acryloyloxyethyl), and phthalate mono(2-methacryloyloxyethyl).

The unsaturated polycarboxylic acid may be mono (meth) acrylate of dicarboxy polymer at either terminal thereof. Examples of the unsaturated polycarboxylic acid may include ω-carboxypolycaprolactonemonoacrylate, and ω-carboxypolycaprolactonemonomethacrylate.

The carboxyl group-containing monomer can be used alone or in combination of two or more.

Another monomer copolymerizable with the carboxyl group-containing monomer may be a monomer having a carbon-carbon unsaturated bond, and specific examples thereof may include vinyl aromatic compounds such as styrene, α-methylstyrene, and vinyl toluene; unsaturated carboxylate compounds such as methyl acrylate, methyl methacrylate, ethyl acrylate, ethyl methacrylate, butyl acrylate, butyl methacrylate, 2-hydroxyethyl acrylate, 2-hydroxyethyl methacrylate, benzyl acrylate and benzyl methacrylate; unsaturated amino alkyl carboxylate compounds such as aminoethyl acrylate; unsaturated glycidyl carboxylate compounds such as glycidyl methacrylate; vinyl carboxylate compounds such as vinyl acetate and vinyl propionate; vinyl cyanide compounds such as acrylonitrile, methyl acrylonitrile and α-chloro acrylonitrile; unsaturated oxetane carboxylate compounds such as 3-methyl-3-acryloxymethyloxetane, 3-methyl-3-methacryloxymethyloxetane, 3-ethyl-3-acryloxymethyloxetane, 3-ethyl-3-methacryloxymethyloxetane, 3-methyl-3-acryloxyethyloxetane, 3-methyl-3-methacryloxyethyloxetane, 3-methyl-3-acryloxyethyloxetane and 3-methyl-3-methacryloxyethyloxetane. The monomer can be used alone or in combination of two or more.

Examples of the copolymer may include 3-ethyl-3-methacryloxymethyloxetane/benzylmethacrylate/methacrylic acid copolymer, 3-ethyl-3-methacryloxymethyloxetane/benzylmethacrylate/methacrylic acid/styrene copolymer, 3-ethyl-3-methacryloxymethyloxetane/methylmethacrylate/methacrylic acid copolymer, and 3-ethyl-3-methacryloxymethyloxetane/methylmethacrylate/methacrylic acid/styrene copolymer.

In the binder resin made of a copolymer, the carboxyl group-containing monomer is preferably contained in an amount of 5 wt % to 50 wt %, more preferably in an amount of 10 wt % to 40 wt %. When the amount of the carboxyl group-containing monomer is within the range stated above, the carboxyl group-containing monomer has high solubility with respect to a developer solution and a colored pattern can be accurately formed during development.

In addition, an acid value of the binder resin is preferably in a range of between 20 and 200 mgKOH/g. When the acid value is within the range stated above, the solubility in a developer solution is improved, thereby allowing an unexposed area to be easily dissolved. Here, the acid value is defined as a value measured as an amount (mg) of potassium hydroxide required for neutralizing 1 g of acrylic polymer and is generally obtained by titration using an aqueous solution of potassium hydroxide.

The binder resin preferably has a weight average molecular weight (MW) in a range of 5000 to 400000, or 10000 to 300000, as measured by gel permeation chromatography (GPC) using polystyrene as a standard material. When the weight average molecular weight (MW) is in the range stated above, surface hardness of the colored pattern is improved, the solubility of a unexposed area is increased and the resolution is improved.

The binder resin is in an amount of 5 wt % to 85 wt %, preferably 20 wt % to 70 wt %, based on solid content of the colored photosensitive resin composition.

When the binder resin is within the amount range stated above, pattern formation is enabled and the resolution and film residue rate are improved.

Photopolymerizable Compound (C)

The photopolymerizable compound is a compound that is polymerizable by active radicals or acids generated from a photoinitiator upon light irradiation. Examples of the photopolymerizable compound may include compounds having polymerizable carbon-carbon unsaturated bonds. The compound may be a monofunctional photopolymerizable compound, bifunctional photopolymerizable compound and a polyfunctional photopolymerizable compound having three or more functional groups.

Examples of the monofunctional photopolymerizable compound may include nonylphenylcarbitolacrylate, 2-hydroxy-3-phenoxypropylacrylate, 2-ethylhexylcarbitolacrylate, 2-hydroxyethylacrylate and N-vinylpyrrolidone.

Examples of the bifunctional photopolymerizable compound may include 1,6-hexanedioldiacrylate, 1,6-hexanedioldimethacrylate, ethylene glycoldiacrylate, ethylene glycoldimethacrylate, neopentyl glycol diacrylte, neopentyl glycol dimethacrylate, triethylene glycoldiacrylate, triethylene glycoldimethacrylate, bis(acryloyloxyethyl)ether of bisphenol A, 3-methyl pentanediol diacrylate pentanediol diacrylate, and 3-methylpentanediol dimethacrylate.

Examples of the polyfunctional photopolymerizable compound having three or more functional groups may include trimethylolpropanetriacrylate, trimethylolpropanetrimethacrylate, pentaerythritoltriacrylate, pentaerythritoltrimethacrylate, pentaerythritoltetraacrylate, pentaerythritoltetramethacrylate, dipentaerythritolpentaacrylate, dipentaerythritolpentamethacrylate, dipentaerythritolhexaacrylate, and dipentaerythritolhexamethacrylate.

The exemplified photopolymerizable compounds can be used alone or in combination of two or more. Specifically, bifunctional or higher-functional photopolymerizable compounds among the photopolymerizable compounds are preferably used.

The photopolymerizable compound is used in an amount of 0.1 to 70 wt %, preferably 1 to 60 wt % based on solid content of the colored photosensitive resin composition. When the photopolymerizable compound is used in the amount range stated above, the strength and smoothness of the colored pattern are improved.

Photoinitiator (D)

Contents of the photoinitiator for achieving a micro-patterned color pattern may vary according to the kind of photoinitiator used, and the use of the photoinitiator may improve physical properties of the micro-patterned color pattern achieved, which will later be described in more detail.

Non-limiting examples of the photoinitiator may include photoinitiators reacting to an ultra-short wavelength of 300 nm or less to generate active radicals or acids to be capable of polymerizing a binder resin and a photopolymerizable compound.

Preferably, the photoinitiator may include at least one selected from the group consisting of acetophenone-based, benzophenone-based, thioxanthone-based and triazine-based photoinitiators. More preferably, the photoinitiator may include at least one selected from the group consisting of acetophenone-based and benzophenone-based photoinitiators.

Examples of the acetophenone-based photoinitiator may include oligomers of diethoxyacetophenone, 2-hydroxy-2-methyl-1-phenylpropane-1-one, benzyldimethylketal, 2-hydroxy-2-methyl-1-[2-(2-hydroxyethoxy)phenyl]propane-1-one, 1-hydroxycyclohexylphenyl ketone, 2-methyl-2-morpolyno-1-(4-methylthiophenyl)propane-1-one, 2-benzyl-2-dimethylamino-1-(4-morpolynophenyl)buthane-1-one and 2-hydroxy-2-methyl-1-[4-(1-methylvinyl)phenyl] propane-1-one.

Examples of the benzophenone-based photoinitiator may include benzophenone, methyl o-benzoylbenzoate, 4-phenylbenzophenone, 4-benzoyl-4'-methyldiphenylsulfide, 3,3', 4,4'-tetra(t-butylperoxycarbonyl)benzophenone, and 2,4,6-trimethylbenzophenone.

Examples of the thioxanthone photoinitiator may include 2-isopropylthioxanthone, 4-isopropylthioxanthone, 2,4-diethylthioxanthone, 2,4-dichlorothioxanthone, and 1-chloro-4-propoxythioxanthone.

Examples of the triazine-based photoinitiator may include 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-piperonyl-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl) ethenyl]-1,3,5-triazine, 2,4-bis(trichloromethyl)-6-[2-(4-diethylamino-2-methylphenyl)ethenyl]-1,3,5-triazine, and 2,4-bis(trichloromethyl)-6-[2-(3,4-dimethoxyphenyl)ethenyl]-1, 3,5-triazine.

As described above, when at least one selected from the group consisting of acetophenone-based, benzophenone-based, thioxanthone-based and triazine-based photoinitiators is used as the photoinitiator, a sufficiently micro-patterned colored pattern can be obtained using an excess of the photoinitiator compared to an amount used in the general colored photosensitive resin composition. The photoinitiator is preferably contained in an amount of 5 wt % to 20 wt %, more preferably in an amount of 10 wt % to 20 wt %, based on solid content of the colored photosensitive resin composition. When the amount of the photoinitiator is less than 5 wt %, the sensitivity in a wavelength of 300 nm or less becomes poor, so that it is not possible to obtain a micro-patterned colored pattern having high resolution. When the amount of the photoinitiator is greater than 20 wt %, the resolution may be lowered. Thus, the photoinitiator is preferably used in the amount range stated above.

The photoinitiator may be an oxime ester photoinitiator. Specific examples of the oxime ester photoinitiator may include 1-(4-phenylthiophenyl)-1,2-octanedione-2-(O-benzoyloxime)), 1-(4-methylsulfanil-phenyl)-buthane-1,2-buthane-2-oxime-O-acetate, 1-(4-methylsulfanil-phenyl)-buthane-1-oneoxime-O-acetate, hydroxyimino-(4-methylsulfanil-phenyl)-acetic acid ethylester-O-acetate, hydroxyimino-(4-methylsulfanil-phenyl)-acetic acid ethylester-O-benzoate, and ethanone-1-[9-ethyl-6-(2-methyl-4tetrahydropyranyloxybenzoyl)-9H-carbazole-3-yl]-1-(O-acetyloxime).

The exemplified oxime ester photoinitiator can be used alone or in combination of two or more.

If the oxime ester photoinitiator is used as the photoinitiator, even a small amount of the photoinitiator may react with high sensitivity with respect to an ultra-short wavelength of 300 nm or less, thereby achieving a micro-patterned colored pattern with a small exposure energy dose.

If the oxime ester photoinitiator is used as the photoinitiator, the photoinitiator is preferably contained in an amount of 1 wt % to 20 wt % based on solid content of the colored photosensitive resin composition. When the amount of the oxime ester photoinitiator is less than 1 wt %, the sensitivity in a wavelength of 300 nm or less may become poor, so that it is not possible to obtain a high-resolution, micro-patterned colored pattern. When the amount of the oxime ester photoinitiator is greater than 20 wt %, the sensitivity is not further improved. Thus, the oxime ester photoinitiator is preferably used in the amount range stated above.

The photoinitiator may include an oxime ester photoinitiator and may further include an additional photoinitiator other than the oxime ester photoinitiator.

Examples of the additional photoinitiator may include at least one selected from the group consisting of an active radical generator such as acetophenone-, benzophenone-, thioxanthone-, triazine- and benzoin-based photoinitiators, a sensitizer and an acid generator.

As described above, at least one selected from the group consisting of oximeester-based, acetophenone-based, benzophenone-based, thioxanthone-based, and triazine-based photoinitiators may be used as the photoinitiator.

Examples of the benzoin-based photoinitiator may include benzoin, benzoinmethyl ether, benzoinethyl ether, benzoinisopropyl ether, and benzoinisobutyl ether.

Examples of the sensitizer may include 2,4,6-trimethyl-benzoyldiphenylphosphineoxide, 2,2'-bis(o-chlorophenyl)-4,4',5,5'-tetraphenyl-1,2'-biimidazole, 10-butyl-2-chloroacridone, 2-ethyl anthraquinone, benzyl, 9,10-phenanethrenequinone, camphorquinone, methylphenyl glyoxylate, and a titanocene compound.

Examples of the acid generator may include onium salts such as 4-hydroxyphenyldimethyl sulfonium p-toluenesulfonate, 4-hydroxyphenyldimethyl sulfonium hexafluoroantimonate, 4-acetoxyphenyldimethyl sulfonium p-toluenesulfonate, 4-acetoxyphenyl.methyl.benzyl sulfonium hexafluoroantimonate, triphenyl sulfonium p-toluenesulfonate, triphenyl sulfonium hexafluoroantimonate, diphenyl iodonium p-toluenesulfonate, and diphenyl iodonium hexafluoroantimonate, nitrobenzyl tosylate and benzoin tosylate.

Among the above-stated compounds, there are compounds as active radical generators capable of generating acids as well as active radicals. For example, the triazine-based photoinitiator is used as an acid generator.

The exemplified photoinitiators can be used alone or in combination of two or more.

When a mixture of an oxime ester photoinitiator and an additional photoinitiator other than the oxime ester photoinitiator is used as the photoinitiator, a micro-patterned colored pattern having excellent line characteristics can be formed.

When a mixture of an oxime ester photoinitiator and an additional photoinitiator other than the oxime ester photoinitiator is used as the photoinitiator, the oxime ester photoinitiator is preferably contained in an amount of 1 to 99 wt % based on the entire amount of the photoinitiator containing the oxime ester photoinitiator. When an amount of the oxime ester photoinitiator is less than 1 wt %, the sensitivity may become poor, so that it is not possible to obtain a high-resolution, micro-patterned colored pattern. When an amount of the oxime ester photoinitiator is greater than 99 wt %, the resolution may be lowered. Thus, the oxime ester photoinitiator is preferably used in the amount range stated above. In addition, the photoinitiator is contained in an amount of 1 to 50 wt % based on the solid content of the colored photosensitive resin composition. When the amount of the photoinitiator is less than 1 wt %, the sensitivity in a wavelength of 300 nm or less may become poor, so that it is not possible to obtain a high-resolution, micro-patterned colored pattern. When the amount of the photoinitiator is greater than 50 wt %, the resolution may be lowered. Thus, the photoinitiator is preferably used in the amount range stated above.

In order to promote polymerization of the photopolymerizable compound, the photoinitiator according to the present invention may be used in combination with a photoinitiation adjuvant.

Examples of the photoinitiation adjuvant may include amine-based photoinitiation adjuvant, and alkoxy anthracene-based photoinitiation adjuvant.

Examples of the amine-based photopolymerization initiator can be used in combination with a photoinitiation adjuvant. Examples of the photopolymerization initiator may include triethanolamine, methyldiethanolamine, triisopropanolamine, methyl 4-dimethylaminobenzoate, ethyl 4-dimethylaminobenzoate, isoamyl 4-dimethylaminobenzoate, 2-dimethylaminoethylbenzoate, 2-ethylhexyl 4-dimethylaminobenzoate, N,N-dimethylp-toluidine, 4,4'-bis(dimethylamino)benzophenone (commonly called Michler's ketone), 4,4'-bis(diethylamino)benzophenone, and 4,4'-bis(ethylmethylamino)benzophenone.

Examples of the alkoxy anthracene-based photoinitiation adjuvant may include 9,10-dimethoxy anthracene, 2-ethyl-9,10-dimethoxy anthracene, 9,10-diethoxy anthracene, and 2-ethyl-9,10-diethoxy anthracene.

When the photoinitiation adjuvant is used, an amount of the photoinitiation adjuvant used is generally 10 moles or less, preferably 0.01 to 5 moles, based on 1 mole of the photoinitiator. When the photoinitiation adjuvant is used in the amount range stated above, the sensitivity of the colored photosensitive resin composition is further improved, thereby advantageously increasing the productivity of the color filter.

Solvent (E)

Non-limiting examples of the solvent may include various kinds of organic solvents used in the field of the colored photosensitive resin composition.

Specific examples of the solvent may include ethylene glycol monoalkyl ethers such as ethylene glycol monomethyl ether, ethylene glycol monoethyl ether, ethylene glycol monopropyl ether, and ethylene glycol monobutyl ether; diethylene glycoldialkyl ethers such as diethylene glycoldimethyl ether, diethylene glycoldiethyl ether, diethylene glycoldipropyl ether, and diethylene glycoldibutyl ether; ethylene glycolalkyletheracetates such as methylcellosolveacetate, and ethylcellosolveacetate; alkylene glycolalkyletheracetates such as propylene glycolmonomethyl etheracetate, propylene glycolmonoethyl etheracetate, propylene glycolmonopropyl etheracetate, methoxybutylacetate, and methoxypentylacetate; aromatic hydrocarbons such as benzene, toluene, and xylene; ketones such as methylethylketone, acetone, methylamylketone, methylisobutylketone, and cyclohexaneone; alcohols such as ethanol, propanol, buthanol, hexanol, cyclohexanol, ethylene glycol, and glycerin; and cyclic esters such as γ-butyrolactone. These solvents can be used alone or in combination of two or more.

The solvent is contained in an amount of 50 wt % to 90 wt %, preferably 60 wt % to 85 wt %, based on the entire amount of the colored photosensitive resin composition including the solvent. When an amount of the solvent is contained in the range of 50 wt % to 90 wt %, the coatability may be improved, which is desirable.

Additives (F)

If necessary, the colored photosensitive resin composition may further include additives.

Examples of the additives may include a filler, another polymer other than a binder resin, an adhesion promoter, an anti-oxidant, a UV absorber, a coagulation preventing agent, an organic acid, an organic amino compound, a hardener, and so on.

Specific examples of the filler may include glass, silica, and alumina.

Examples of the polymer other than a binder resin may include polyvinyl alcohol, polyacrylic acid, polyethylene glycol monoalkylether, and polyfluoroalkylacrylate.

Examples of the adhesion promoter may include vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, and 3-mercaptopropyltrimethoxysilane.

Examples of the anti-oxidant may include 2,2-thiobis(4-methyl-6-t-butylphenol) and 2,6-di-t-butylphenol.

Examples of the UV absorber may include 2-(3-t-butyl-5-methyl-2-hydroxyphenyl)-5-chlorobenzotriazole, and alkoxybenzophenone.

Examples of the coagulation preventing agent may include sodium polyacrylate.

Examples of the organic acid may include aliphatic monocarboxylic acids such as formic acid, acetic acid, propionic acid, butyric acid, valeric acid, pivalic acid, caproic acid, diethyl acetic acid, enanthic acid, caprylic acid and the like; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methyl succinic acid, tetramethyl succinic acid, cyclohexanedicarboxylic acid, itaconic acid, citracomic acid, maleic acid, fumaric acid, mesaconic acid and the like; aliphatic tricarboxylic acids such as tricarboxylic acid, aconitic acid, camphoric acid and the like; aromatic monocarboxylic acids such as benzoic acid, toluic acid, cumenic acid, hemellitic acid, mesitylenic acid and the like; aromatic dicarboxylic acids such as phthalic acid, isophthalic acid, terephthalic acid and the like; aromatic polycarboxylic acids such as trimellitic acid, trimesic acid, mellophanic acid, pyromellitic acid and the like; and others.

Examples of the organic amino compound may include mono(cyclo)alkyl amines such as n-propylamine, i-propylamine, n-butylamine, i-butylamine, s-butylamine, t-butyl amine, n-pentylamine, n-hexylamine, n-heptylamine, n-octylamine, n-nonylamine, n-decylamine, n-undecylamine, n-dedecylamine, cyclohexylamine, 2-methylcyclohexylamine, 3-methylcyclohexylamine, 4-methylcyclohexylamine and the like; di(cyclo)alkyl amines such as methylethylamine, diethylamine, methyln-propylamine, ethyl n-propylamine, di n-propylamine, di i-propylamine, di n-butylamine, di i-butylamine, di s-butylamine, di t-butylamine, di n-pentylamine, di n-hexylamine, methylcyclohexylamine, ethylcyclohexylamine, di cyclohexylamine and the like; tri(cyclo)alkyl amines such as dimethylethylamine, methyldiethylamine, triethylamine, dimethyl n-propylamine, diethyl n-propylamine, methyldi n-propylamine, ethyldi n-propylamine, tri n-propylamine, tri i-propylamine, tri n-butylamine, tri i-butylamine, tri s-butylamine, tri t-butylamine, tri n-pentylamine, tri n-hexylamine, dimethylcyclohexylamine, diethylcyclohexylamine, methyldicyclohexylamine, ethyldicyclohexylamine, tricyclohexylamine and the like; mono(cyclo)alkanolamines such as 2-aminoethanol, 3-amino-1-propanol, 1-amino-2-propanol, 4-amino-1-butanol, 5-amino-1-pentanol, 6-amino-1-hexanol, 4-amino-1-cyclohexanol and the like; di(cyclo)alkanolamines such as diethanolamine, di n-propanolamine, di i-propanolamine, di n-buthanolamine, di i-buthanolamine, di n-pentanolamine, di n-hexanolamine, di(4-cyclohexanol)amine and the like; tri(cyclo)alkanolamines such as triethanolamine, tri n-propanolamine, tri i-propanolamine, tri n-buthanolamine, tri i-buthanolamine, tri n-pentanolamine, tri n-hexanolamine, tri(4-cyclohexanol) amine and the like; amino(cyclo)alkane diols such as 3-amino-1,2-propane diol, 2-amino-1,3-propane diol, 4-amino-1,2-buthane diol, 4-amino-1,3-buthane diol, 4-amino-1,2-cyclohexane diol, 4-amino-1,3-cyclohexane diol, 3-dimethylamino-1,2-propane diol, 3-diethylamino-1,2-propane diol, 2-dimethylamino-1,3-propane diol, 2-diethylamino-1,3-propane diol and the like; amino-group containing cycloalkane methanols such as 1-aminocyclopentaneone methanol, 4-aminocyclopentaneone methanol, 1-aminocyclohexaneone methanol, 4-aminocyclohexaneone methanol, 4-dimethylaminocyclopentane methanol, 4-diethylaminocyclopentane methanol, 4-dimethylaminocyclohexane methanol, 4-diethylaminocyclohexane methanol and the like; aminocarboxylic acids such as β-alanine, 2-aminobutyric acid, 3-aminobutyric acid, 4-aminobutyric acid, 2-aminoisobutyric acid, 3-aminoisobutyric acid, 2-aminovaleric acid, 5-aminovaleric acid, 6-aminocaproic acid, 1-aminocyclopropanecarboxylic acid, 1-aminocyclohexanecarboxylic acid, 4-aminocyclohexanecarboxylic acid and the like; aromatic amines such as aniline, o-methylaniline, m-methylaniline, p-methylaniline, p-ethylaniline, p-n-propylaniline, p-i-propylaniline, p-n-butylaniline, p-t-butylaniline, 1-naphthylamine, 2-naphthylamine, N,N-dimethylaniline, N,N-diethylaniline, p-methyl-N,N-dimethylaniline and the like; aminobenzyl alcohols such as o-aminobenzyl alcohol, m-aminobenzyl alcohol, p-aminobenzyl alcohol, p-dimethylaminobenzyl alcohol, p-diethylaminobenzyl alcohol and the like; aminophenols such as o-aminophenol, m-aminophenol, p-aminophenol, p-dimethylaminophenol, p-diethylaminophenol and the like; aminobenzoic acids such as m-aminobenzoic acid, p-aminobenzoic acid, p-dimethylaminobenzoic acid, p-diethylaminobenzoic acid and the like; and others.

Hardeners may be used in order to increase the mechanical strength of the colored pattern by hardening it through heat treatment after development.

Examples of the hardeners may include compounds which can cross-link a binder resin by a reaction with a carboxyl group in the binder polymer under heating, and the hardener may harden the colored pattern by the cross-linkage of the binder polymer. The hardeners may also be compounds which can polymerize themselves by heating, and they harden the color pixel or the like by self-polymerization. Examples of these compounds include epoxy compounds, oxetane compounds and the like.

Examples of the epoxy compounds include epoxy resins such as bisphenol A type epoxy resins, hydrogenated bisphenol A type epoxy resins, bisphenol F type epoxy resins, hydrogenated bisphenol F type epoxy resins, novolak type epoxy resins, other aromatic epoxy resins, alicyclic epoxy resins, heterocyclic epoxy resins, glycidyl ester resins, glycidyl amine resins, epoxidized oil and the like; brominated derivatives of these epoxy resins; aliphatic, alicyclic or aromatic epoxy compounds other than the epoxy resins and their brominated derivatives; epoxidized products of butadiene (co)polymers; epoxidized products of isoprene (co)polymers; glycidyl (meth)acrylate (co)polymers; triglycidyl isocyanurate and the like.

Examples of the oxetane compounds include carbonate bisoxetane, xylene bisoxetane, adipate bisoxetane, terephtharate bisoxetane, cyclohexane dicarboxylic acid bisoxetane and the like.

The colored photosensitive composition of the invention may contain, together with a hardener, a compound which can cause the ring-opening polymerization of an epoxy group in epoxy compounds or an oxetane nucleus in oxetane compounds. Examples of such compounds include polybasic carboxylic acids, polybasic carboxylic acid anhydrides, acid generators and the like. These compounds can be used alone or in combination of two or more.

Examples of the polycarboxylic acid may include aromatic polycarboxylic acids such as phthalic acid, 3,4-dimethylphthalic acid, isophthalic acid, terephthalic acid, pyromellitic acid, trimellitic acid, 1,4,5,8-naphthalenetetracarboxylic acid, 3,3',4,4'-benzophenonetetracarboxylic acid and the like; aliphatic polybasic carboxylic acids such as succinic acid, glutaric acid, adipic acid, 1,2,3,4-butanetetracarboxylic acid, maleic acid, fumaric acid, itaconic acid and the like; alicyclic polybasic carboxylic acids such as hexahydrophthalic acid, 3,4-dimethyltetrahydrophthalic acid, hexahydroisophthalic acid, hexahydroterephthalic acid, 1,2,4-cyclopentanetricarboxylic acid, 1,2,4-cyclohexanetricarboxylic acid, cyclopentanetetracarboxylic acid, 1,2,4,5-cyclohexanetetracarboxylic acid and the like; and others.

Examples of polybasic carboxylic acid anhydrides include aromatic polybasic carboxylic acid anhydrides such as phthalic acid anhydride, pyromellitic acid anhydride, trimellitic acid anhydride, 3,3',4,4'-benzophenonetetracarboxylic acid dianhydride and the like; aliphatic polybasic carboxylic acid anhydrides such as itaconic acid anhydride, succinic acid anhydride, citraconic acid anhydride, dodecenylsuccinic acid anhydride, tricarballylic acid anhydride, maleic acid anhydride, 1,2,3,4-butanetetracarboxylic acid dianhydride and the like; alicyclic polybasic carboxylic acid anhydrides such as hexahydrophthalic acid anhydride, 3,4-dimethyltetrahydrophthalic acid anhydride, 1,2,4-cyclopentanetricarboxylic acid anhydride, 1,2,4-cyclohexanetricarboxylic acid anhydride, cyclopentanetetracarboxylic acid dianhydride, 1,2,4,5-cyclohexanetetracarboxylic acid dianhydride, hymic anhydride, nadic anhydride and the like; ester-group containing carboxylic acid anhydrides such as ethylene glycol bistrimellitic acid anhydride, glycerol tristrimellitic acid anhydride and the like; and others.

The colored photosensitive composition of the invention can be produced in the following manner. For example, the colored photosensitive composition of the invention can be produced by mixing a colorant (A) with a solvent (F) and dispersing the mixture using a bead mill until an average diameter of a colored material reaches 0.2 µm or less. If desired, a pigment dispersant may further be used. The binder resin (B) may be combined in part or in whole. A balance amount of the binder resin (B), a photopolymerizable compound (C) and a photoinitiator (D), or other additives and additional solvent (E), if necessary, may further be added to the obtained dispersing solution (which may also be referred to as a mill base, hereinafter), followed by sufficiently agitating, thereby obtaining the colored photosensitive resin composition according to the present invention.

A color filter is fabricated using the aforementioned colored photosensitive resin composition according to the present invention.

Hereinafter, a method for fabricating a color filter using the colored photosensitive resin composition will be described.

The method for fabricating a color filter using the colored photosensitive resin composition includes forming a coating film by coating the colored photosensitive resin composition on a substrate, exposing to light through a mask by irradiating ultra-short wavelength laser into a potential color pattern area of the coating film by an ultra-short wavelength laser exposing device of 300 nm or less; and conducting a development on the coating film by removing an unexposed coating area that is not exposed to laser in the exposing step to form a colored pattern.

In the forming of the coating film, the coating film is formed by coating the colored photosensitive resin composition on the substrate. Here, the substrate may include a glass substrate, a silicon wafer, a plastic substrate made of polyethersulfone (PES) or polycarbonate (PC), but not limited thereto.

The coating may be performed using a coating apparatus such as a roll coater, a spin coater, a slit-and-spin coater, a slit coater (to be also referred to as a 'dye coater'), an ink jet, and the like.

The coating may be performed in various thicknesses without limitation, but is preferably coated to a thickness ranging from 0.5 µm to 1.0 µm. It is important to perform the coating to obtain the coating film having a uniform thickness over the entire surface of the coating film. When the thickness in the coating is within the range stated above, surface smoothness of the coating film is improved and hardening is facilitated, thereby improving the production rate.

If the coating of the colored photosensitive resin composition is completed, volatile components such as a solvent are removed through preliminary drying, thereby obtaining a coating film. The preliminary drying may be performed at 100 to 120° C. for 1 to 30 minutes. When the preliminary drying is performed within the ranges stated above, the volatile components such as a solvent are rapidly removed, thereby obtaining a good dry coating film.

In the exposing, ultra-short wavelength laser of 300 nm or less is irradiated into a potential colored pattern area of the coating film using a mask by an ultra-short wavelength exposing device.

A generally known KrF (248 nm) scanner may be used as the laser having a wavelength of 300 nm or less. The KrF scanner is an exposing device that irradiates laser having a wavelength of 248 nm using a KrF source.

If the exposing is performed on the potential colored pattern area of the coating film formed in the forming of the coating film, crosslinkage and photocuring occur only to light-transmitted portions through the mask as the result of the function of a photoinitiator.

In the exposure, an exposure energy dose is 300 mJ/cm$^2$ or less, preferably 200 mJ/cm$^2$ or less, more preferably 50 to 150 mJ/cm$^2$, but aspects of the present invention are not limited thereto. When the exposure amount exceeds 300 mJ/cm$^2$, the overall processing time may increase due to a delay in the exposing process and lifetime of the exposing device may be shortened due to distortion of a lens in the exposing device.

In the development, an unexposed coating film area is removed to form a colored pattern.

A developer solution used to remove the unexposed coating film in the development may include a developer that is generally used in the related art. The developer solution is generally an aqueous solution including an alkaline compound and a surfactant.

The alkaline compound included in the developer solution may be either an inorganic alkaline compound or an organic alkaline compound. Specific examples of the inorganic alkaline compound may include sodium hydroxide, potassium hydroxide, monobasic sodium phosphate, sodium dihydrogen phosphate, diammonium hydrogen phosphate, ammonium dihydrogenphosphate, monopotassium phosphate, sodium silicates, potassium silicate, sodium carbonate, potassium carbonate, sodium hydrogen carbonate, potassium hydrogen carbonate, sodium borate, potassium borate, ammonia and the like. Specific examples of the organic alkaline compound may include tetramethyl ammonium hydroxide, 2-hydroxyethyltrimethyl ammonium hydroxide, monomethylamine, dimethylamine, trimethylamine, monoethylamine, diethylamine, triethylamine, monoisopropylamine, diisopropylamine, ethanolamine and the like. These inorganic and organic alkaline compounds can be used alone or in combination of two or more.

A concentration of the alkaline compound in the developer solution is preferably in a range of 0.01 to 10 wt %, more preferably in a range of 0.03 to 5 wt %.

The surfactant included in the developer solution may be a non-ionic-based surfactant, a negative ionic-based surfactant or a positive ionic surfactant. Specific examples of the non-ionic surfactant may include polyoxyethylene alkylether, polyoxyethylene arylether, polyoxyethylene alkylarylether, and other polyoxyethylene derivatives, oxyethylene-oxypropylene block copolymer, sorbitan fatty acid ester, polyoxyethylene sorbitan fatty acid ester, polyoxyethylene sorbitol fatty acid ester, glycerin fatty acid ester, polyoxyethylene fatty acid ester, polyoxyethylene alkyl amine and the like. Specific examples of the negative ionic surfactant may include higher alcohol sulfate ester salts such as lauryl alcohol sulfate ester sodium, oleyl alcohol sulfate ester sodium and the like; alkyl sulfates such as lauryl sodium sulfate, lauryl ammonium sulfate and the like; alkylaryl sulfonic acid salts such as dedecylbenzene sodium sulfonate, dedecyl naphthalene sodium sulfonate and the like. Specific examples of the positive ionic surfactant may include amine salts such as stearylamine chlorate, lauryltrimethyl ammonium chloride; and quarternary ammonium salts. These surfactants can be used alone or in combination of two or more.

A concentration of the surfactant in the developer solution may be in a range of 0.01 to 10 wt %, preferably 0.05 to 8 wt %, more preferably 0.1 to 5 wt %.

After the development, if necessary, the color filter having a colored pattern may be subjected to post-heat treatment at a temperature ranging from 150 to 230□ for 1 to 60 minutes. The post-heat treatment is performed for the purpose of firmly hardening the colored pattern while completely removing a solvent remaining on the pattern.

The present invention provides a color filter fabricated by the fabrication method of a color filter for a solid state imaging device.

The color filter has a micro-patterned colored pattern by using an ultra-short wavelength exposing device in the course of fabricating the same. In particular, the colored pattern obtained in the present invention may have a pattern size of 1.5 µm or less, specifically 1.0 µm or less, which is remarkably finer than the currently commercially pattern of 2.2 µm. Accordingly, the color filter having the micro-patterned colored pattern can be advantageously applied to a solid state imaging device.

The present invention also provides a solid state imaging device including the color filter. The solid state imaging device may have a configuration that is well known to one skilled in the related art, except that it includes a color filter according to the present invention.

The invention will now be described in more detail with reference to Examples, which should not be construed as a limitation upon the scope of the invention. In addition, it is noted that "%" or "part" used to indicate the content throughout the following examples means % by weight or parts by weight, unless expressly specified otherwise.

Example 1

A bill base was acquired, the bill base including 28.5% of C.I.pigment red 254 and 9.5% of C.I.pigment yellow 139 as colorants, and 6.44% of a polyester-based dispersant, based on 100% of a total solid content (excluding a solvent) of the photosensitive resin composition. Thereafter, propylene glycolmethyl etheracetate as a solvent was added to 25.15% of a binder resin (weight average molecular weight: 22,000; acid value: 80 mgKOH/g; copolymer of methacrylic acid and benzylmethacrylate), 12.58% of a photopolymerizable compound (dipentaerythritol hexaacrylate (KAYARAD DPHA; Nippon Kayaku Co. Ltd.), 12.58% of pentaerythritol triacrylate (Miwon Commerical Co., Ltd.), 5% of 1-hydroxycyclohexylphenylketone (Irgacure 184; Ciba Specialty Chemical Co.) as a photoinitator, and 0.25% of 2-(3,4-epoxycyclohexyl)-ethyltrimethoxysilane as an adhesion promoter in a weight ratio of solid to solvent being 2:8) and mixed with the mill base with stirring at 23□, thereby preparing a colored photosensitive resin composition.

Examples 2-4

Colored photosensitive resin compositions were prepared in the same manner as in Example 1, except that various ingredients were used in amounts as listed in Table 1.

Example 5

A colored photosensitive resin composition was prepared in the same manner as in Example 3, except that 2-benzyl-1-dimethylamino-1-(4-morpolynophenyl)-buthane-1-one (Irgacure 369; Ciba Specialty Chemical Co.) was used as a photoinitiator in Example 3.

TABLE 1

| | Example 1 | Example 2 | Example 3 | Example 4 | Example 5 |
|---|---|---|---|---|---|
| (A-4) | 28.50 | 28.50 | 28.50 | 28.50 | 28.50 |
| (A-2) | 9.50 | 9.50 | 9.50 | 9.50 | 9.50 |
| (A-3) | 6.44 | 6.44 | 6.44 | 6.44 | 6.44 |
| (B) | 25.15 | 22.66 | 20.18 | 17.68 | 20.18 |
| (C-1) | 12.58 | 11.34 | 10.09 | 8.85 | 10.09 |
| (C-2) | 12.58 | 11.34 | 10.09 | 8.85 | 10.09 |
| (D) | 5.00 | 10.00 | 15.00 | 20.00 | 15.00 |
| (F-1) | 0.25 | 0.22 | 0.20 | 0.18 | 0.20 |

The ingredients used in Table 1 are as follows:
(A-4) C.I. pigment red 254;
(A-2) C.I. pigment yellow 139;
(A-3) Polyester-based dispersant;
(B) Copolymer of methacrylic acid and benzylmethacrylate;
(C-1) Dipentaerythritol hexaacrylate;
(C-2) Pentaerythritol triacrylate;
(D) 1-hydroxy cyclohexyl phenylketone; and
(F-1) 2-(3,4-epoxycyclohexyl)-ethyltrimethoxysilane.

Experimental Example 1

Each of the colored photosensitive resin compositions prepared in Examples 1 to 5 was coated on a surface of a 4-inch Si-wafer in a clean room of 23□ by spin coating, followed by drying at 90□ for 90 seconds to evaporate volatile components, thereby forming a colored photosensitive resin composition layer. After cooling the colored photosensitive resin composition layer to 23□, exposure was conducted on the colored photosensitive resin composition layer using a KrF scanner exposing device (248 nm). A 1.5 μm-sized photomask for forming dot-type color pixels was used. Next, a development was conducted in a developer solution (an aqueous solution containing 0.2 wt % of tetramethyl ammonium hydroxide 0.2) at 23□ using a puddle for 60 seconds, followed by washing using pure water and performing post-heat treatment at 220□ for 180 seconds, thereby forming colored pixels.

Figure 1:
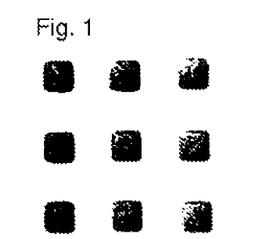
FIGS. 1 to 5 are scanning electron microscope (SEM) photographs of colored patterns fabricated in Examples 1 to 5.
Figure 2:
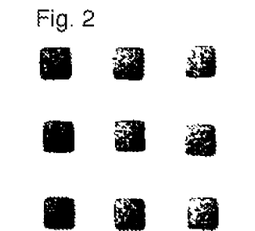
Figure 3:
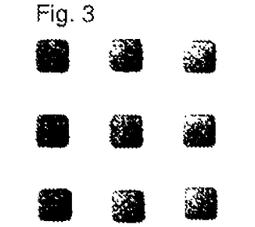
Figure 4:
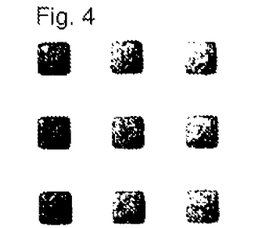
Figure 5:
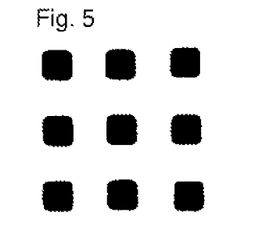

The thus-obtained colored pattern was identified by scanning electron microscopy (SEM) to have a pattern size of 1.5 μm, and the results thereof are shown in FIGS. 1 to 5. FIG. 1 shows the SEM observation result for Example 1, FIG. 2 shows the SEM observation result for Example 2, FIG. 3 shows the SEM observation result for Example 3, FIG. 4 shows the SEM observation result for Example 4, and FIG. 5 shows the SEM observation result for Example 5.

As shown in FIGS. 1 to 5, in Examples 1-5 in which colored patterns were formed from the colored photosensitive resin compositions added in amounts within a desired range of the present invention using acetophenone- or benzophenone-based photoinitiators, the formed color patterns had good pattern profiles of a square shape, a small size and little line edge roughness (LER) while not demonstrating a scum and a top loss after development. Here, in a case of using the acetophenone- or benzophenone-based photoinitiators, an optimum exposure energy dose should be 200 mJ/cm$^2$ or more.

Example 6

A bill base was acquired, the bill base including 23.8% of C.I.pigment green 36 and 10.2% of C.I.pigment yellow 139 as colorants, and 5.14% of a polyester-based dispersant, based on 100% of a total solid content (excluding a solvent) of the photosensitive resin composition. Thereafter, propylene glycolmethyl etheracetate as a solvent was added to 25.15% of a binder resin (weight average molecular weight: 30,000; acid value: 70 mgKOH/g; copolymer of methacrylic acid and benzylmethacrylate), 17.77% of a photopolymerizable compound (dipentaerythritol hexaacrylate (KAYARAD DPHA; Nippon Kayaku Co. Ltd.), 5.92% of pentaerythritol triacrylate (Miwon Commerical Co., Ltd.), 1% of ethanone-1-[9-ethyl-6-(2-methyl-4tetrahydropyranyloxybenzoyl)-9H-carbazole-3-yl]-1-(O-acetyloxime)(Irgacure OXE02; Ciba Specialty Chemical Co.) as a photoinitator, 0.31% of 2-(3,4-epoxycyclohexyl)-ethyltrimethoxysilane as an adhesion promoter and 0.31% of hydroquinonemonomethyl ether as an anti-oxidizing agent in a weight ratio of solid to solvent being 2:8) and mixed with the mill base with stirring at 23□, thereby preparing a colored photosensitive resin composition.

Examples 7-9

Colored photosensitive resin compositions were prepared in the same manner as in Example 6, except that various ingredients were used in amounts as listed in Table 2.

TABLE 2

| | Example 6 | Example 7 | Example 8 | Example 9 |
|---|---|---|---|---|
| (A-1) | 23.8 | 23.8 | 23.8 | 23.8 |
| (A-2) | 10.2 | 10.2 | 10.2 | 10.2 |

TABLE 2-continued

|   | Example 6 | Example 7 | Example 8 | Example 9 |
|---|---|---|---|---|
| (A-3) | 5.14 | 5.14 | 5.14 | 5.14 |
| (B) | 35.55 | 33.16 | 30.2 | 27.22 |
| (C-1) | 17.77 | 16.59 | 15.1 | 13.62 |
| (C-2) | 5.92 | 5.53 | 5.04 | 4.54 |
| (D) | 1 | 5 | 10 | 15 |
| (F-1) | 0.31 | 0.29 | 0.26 | 0.24 |
| (F-2) | 0.31 | 0.29 | 0.26 | 0.24 |

The ingredients used in Table 2 are as follows:
(A-1) C.I. pigment green 36;
(A-2) C.I. pigment yellow 139;
(A-3) Polyester-based dispersant;
(B) Copolymer of methacrylic acid and benzylmethacrylate;
(C-1) Dipentaerythritol hexaacrylate;
(C-2) Pentaerythritol triacrylate
(D) Ethanone-1-[9-ethyl-6-(2-methyl-4tetrahydropyranyloxybenzoyl)-9H-carbazole-3-yl]-1-(O-acetyloxime);
(F-1) 2-(3,4epoxycyclohexyl)-ethyltrimethoxysilane; and
(F-2) Hydroquinone monomethyl ether.

Experimental Example 2

Each of the colored photosensitive resin compositions prepared in Examples 6 to 9 was coated on a surface of a 4-inch Si-wafer in a clean room of 23☐ by spin coating, followed by drying at 90☐ for 90 seconds to evaporate volatile components, thereby forming a colored photosensitive resin composition layer. After cooling the colored photosensitive resin composition layer to 23☐, exposure was conducted on the colored photosensitive resin composition layer using a KrF scanner exposing device (248 nm). A 1.5 µm-sized photo-mask for forming dot-type color pixels was used.

Next, a development was conducted in a developer solution (an aqueous solution containing 0.2 wt % of tetramethyl ammonium hydroxide) at 23☐ using a puddle for 60 seconds, followed by washing using pure water and performing post-heat treatment at 220☐ for 180 seconds, thereby forming colored pixels.

Figure 6:
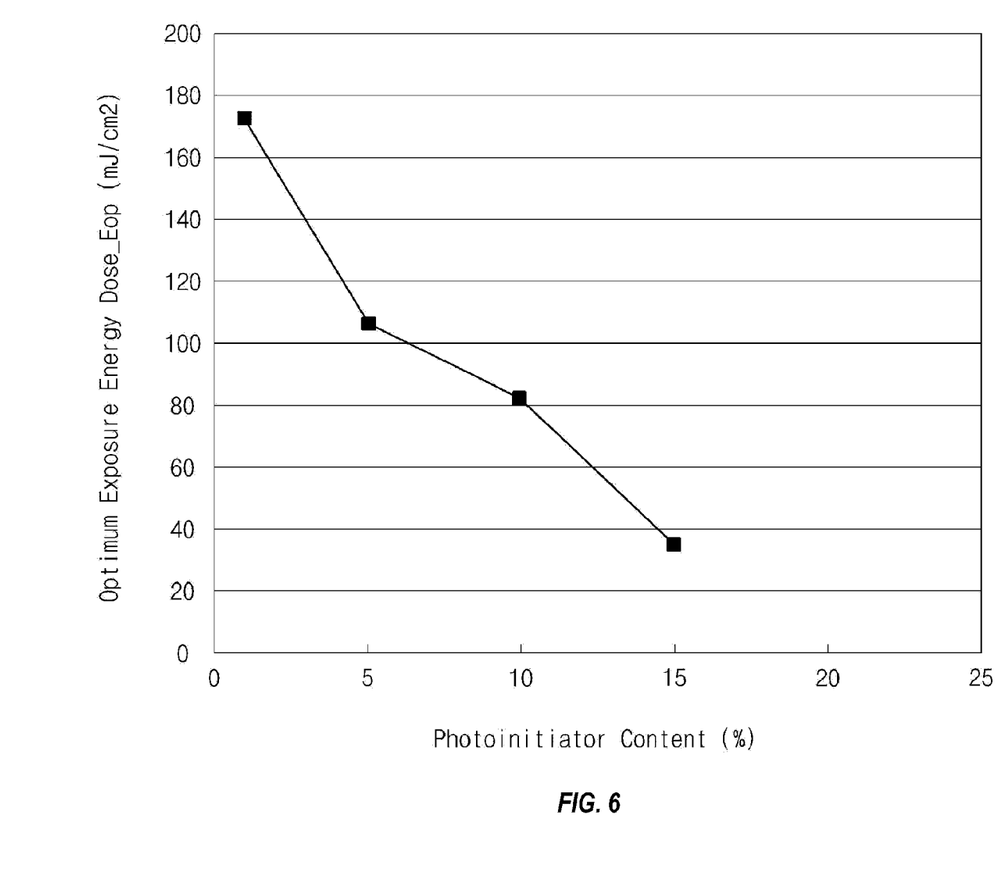
FIG. 6 is a graph illustrating optimum exposure energy doses by content of oxime ester photoinitiators in Examples 6 to 9.

When the thus-obtained colored patterns formed using the 1.5 µm-sized photo-mask have a pattern size of 1.5 µm, as identified by scanning electron microscopy (SEM), an optimum exposure energy dose (Eop) of each of the colored patterns was measured and the measurement results are shown in Table 3 and FIG. 6.

TABLE 3

| Optimum exposure energy dose_Eop (mJ/cm$^2$) | |
|---|---|
| Example 6 | 172 |
| Example 7 | 106 |
| Example 8 | 82 |
| Example 9 | 35 |

As shown in Table 3 and FIG. 6, the colored photosensitive resin compositions prepared in Examples 6-9, in which an oxime ester photoinitiator was used as a photoinitiator, could achieve high sensitivity by reducing a crosslinkage time and exposure energy dose using only a small amount of photoinitiator used. Here, when only the oxime ester photoinitiator is used, a colored pattern having a small pattern size can be obtained even with a wavelength of 300 nm or less. In this case, however, colored pixels each having a size of 1.3 µm or less, relative to color pixels having a 1.4 µm pixel size, may be misaligned.

Example 10

A bill base was acquired, the bill base including 28.5% of C.I.pigment red 254 and 9.5% of C.I.pigment yellow 139 as colorants, and 6.44% of a polyester-based dispersant, based on 100% of a total solid content (excluding a solvent) of the photosensitive resin composition. Thereafter, propylene glycolmethyl etheracetate as a solvent was added to 26% of a binder resin (weight average molecular weight: 20,000; acid value: 120 mgKOH/g; a copolymer of methacrylic acid and benzylmethacrylate), 8.67% of a photopolymerizable compound (dipentaerythritol pentaacrylate; TOAGOSEI Co. Ltd.), 8.67% of pentaerythritol triacrylate (Miwon Commerical Co., Ltd.), 10% of ethanone-1-[9-ethyl-6-(2-methyl-4tetrahydropyranyloxybenzoyl)-9H-carbazole-3-yl]-1-(O-acetyloxime) (Irgacure OXE02; Ciba Specialty Chemical Co.) and 2% of 1-hydroxy cyclohexyl phenylketone (Irgacure 184; Ciba Specialty Chemical Co.) as photoinitators, and 0.22% of 2-(3,4-epoxycyclohexyl)-ethyltrimethoxysilane as an adhesion promoter in a weight ratio of solid to solvent being 2:8) and mixed with the mill base with stirring at 23☐, thereby preparing a colored photosensitive resin composition.

Example 11

A colored photosensitive resin compositions was prepared in the same manner as in Example 10, except that 2% of 2,4-bis(trichloromethyl)-6-(4-methoxystyryl)-1,3,5-triazine (TAZ-TMS; Midori Kagaku Co. Ltd.), instead of 1-hydroxy cyclohexyl phenylketone (Irgacure 184; Ciba Specialty Chemical Co.), was used as a photoinitiator.

Experimental Example 3

Each of the colored photosensitive resin compositions prepared in Examples 10 and 11 was coated on a surface of a 4-inch Si-wafer in a clean room of 23☐ by spin coating, followed by drying at 90☐ for 90 seconds to evaporate volatile components, thereby forming a colored photosensitive resin composition layer. After cooling the colored photosensitive resin composition layer to 23☐, exposure was conducted on the colored photosensitive resin composition layer using a KrF scanner exposing device (248 nm). A photo-mask for forming dot-type color pixels was used. Next, a development was conducted in a developer solution (an aqueous solution containing 0.2 wt % of tetramethyl ammonium hydroxide) at 23☐ using a puddle for 60 seconds, followed by washing using pure water and performing post-heat treatment at 220☐ for 180 seconds, thereby forming colored pixels.

Figure 7:
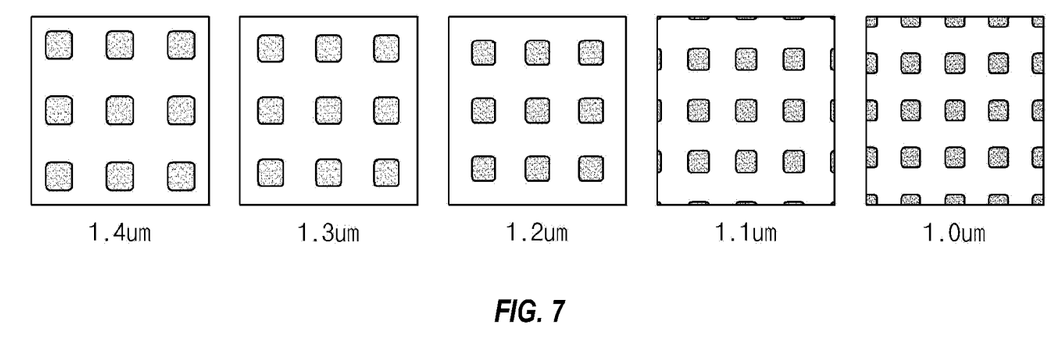
FIGS. 7 and 8 are scanning electron microscope (SEM) photographs of colored patterns subjected to limit resolution experiments using colored photosensitive resin compositions prepared in Examples 10 and 11.
Figure 8:
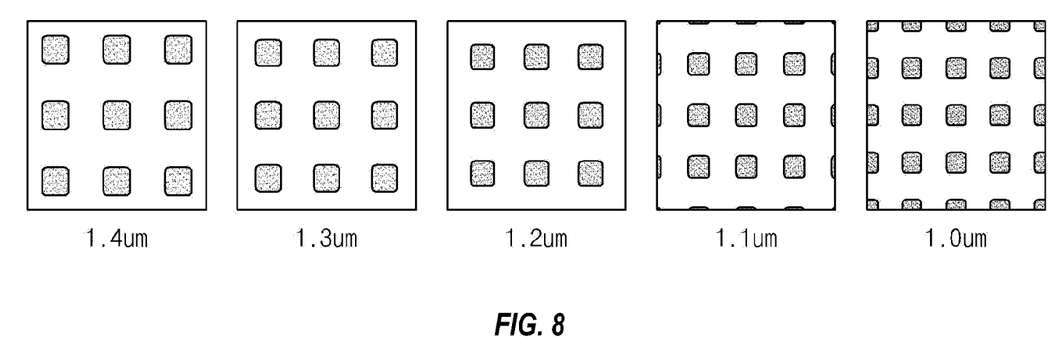

Assuming that the exposure energy dose measured when each of the thus-obtained colored patterns has the same pattern size as that of the photo-mask, as identified by scanning electron microscopy (SEM), is an optimum exposure energy dose, the exposure energy dose of each of the colored patterns was measured and the SEM photographs of the colored patterns each having a pattern size ranging from 1.4 µm to 1.0 µm are shown in FIGS. 7 and 8. Here, FIG. 7 shows the SEM observation result for Example 10, and FIG. 8 shows the SEM observation result for Example 11.

As shown in FIGS. 7 and 8, the colored photosensitive resin compositions prepared in Examples 10 and 11, in which a mixed photoinitiator of oxime ester photoinitiator and additional photoinitiator was used, could achieve colored patterns having good pattern profiles of a square shape, a small pattern size and little line edge roughness (LER) while not demonstrating a scum and a top loss after development. Here, an optimum exposure energy dose was 90 mJ/cm$^2$. In particular, in Example 10, a good colored pattern could be obtained while having a reduced pattern size of 1.0 µm.

Therefore, it is possible to form a high-resolution, micropatterned colored pattern having good line characteristics even with a small exposure energy dose of 200 mJ/cm$^2$ or less by using a mixed photoinitiator of an oximeester-based photoinitiator and another photoinitiator.

Although exemplary embodiments of the present invention have been described in detail hereinabove, it should be understood that many variations and modifications of the basic inventive concept herein described, which may appear to those skilled in the art, will still fall within the spirit and scope of the exemplary embodiments of the present invention as defined by the appended claims.

What is claimed is:

1. A method for fabricating a color filter for a solid state imaging device using an ultra-short wavelength exposing device, the method comprising:
  forming a coating film by coating a colored photosensitive resin composition for each of various colors on a substrate, the colored photosensitive resin composition including:
    a colorant,
    a binder resin having an acid value between 20 and 200 mg KOH/g,
    a photopolymerizable compound, and
    a photoinitiator reacting at a wavelength of 300 nm or less, and
    a solvent selected from the group consisting of ethylene glycol monoalkyl ethers, ethylene glycolalkyletheracetates, diethylene glycodialkyl ethers, alkylene glycolalkyletheracetates, aromatic hydrocarbons, ketones alcohols, cyclic esters, and combinations thereof;
  exposing to light through a mask by irradiating ultra-short wavelength laser into a potential color pattern area of the coating film by an ultra-short wavelength KrF scanner having a wavelength of 248 nm; and
  conducting a development on the coating film by removing an unexposed coating area that is not exposed to laser in the exposing step to form a colored pattern.

2. The method of claim 1, wherein the forming of the coating film comprises forming the coating film by coating the colored photosensitive resin composition to a thickness ranging from 0.5 µm to 1.0 µm.

3. The method of claim 1, wherein in the exposing, an exposure energy dose is 200 mJ/cm$^2$ or less.

4. A method for fabricating a color filter for a solid state imaging device using an ultra-short wavelength exposing device, the method comprising:
  forming a coating film by coating a colored photosensitive resin composition for each of various colors on a substrate, the colored photosensitive resin composition including:
    a colorant,
    a binder resin having an acid value between 20 and 200 mg KOH/g,
    a photopolymerizable compound,
    a photoinitiator reacting at a wavelength of 300 nm or less, and
    a solvent added in an amount of 50 wt % to 90 wt % a complete mass of the colored photosensitive resin composition, wherein the solvent is selected from the group consisting of ethylene glycol monoalkyl ethers, ethylene glycolalkyletheracetates, diethylene glycodialkyl ethers, alkylene glycolalkyletheracetates, aromatic hydrocarbons, ketones alcohols, cyclic esters, and combinations thereof;
  exposing to light through a mask by irradiating ultra-short wavelength laser into a potential color pattern area of the coating film by an ultra-short wavelength KrF scanner having a wavelength of 248 nm; and
  conducting a development on the coating film by removing an unexposed coating area that is not exposed to laser in the exposing step to form a colored pattern.

5. The method of claim 4, wherein the photoinitiator is an oxime ester photoinitiator.

6. The method of claim 4, wherein the photoinitiator is other than an oxime ester photoinitiator.

* * * * *